US009368658B2

(12) United States Patent
Purkl et al.

(10) Patent No.: US 9,368,658 B2
(45) Date of Patent: Jun. 14, 2016

(54) SERPENTINE IR SENSOR (71) Applicant: Robert Bosch GmbH, Stuttgart (DE)

(72) Inventors: Fabian Purkl, Gerlingen (DE); Gary Yama, Mountain View, CA (US); Ando Feyh, Palo Alto, CA (US); Gary O'Brien, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 292 days.

(21) Appl. No.: 13/975,577

(22) Filed: Aug. 26, 2013

(65) Prior Publication Data

US 2014/0061845 A1  Mar. 6, 2014

Related U.S. Application Data (60) Provisional application No. 61/695,361, filed on Aug. 31, 2012.

(51) Int. Cl.
| | |
|---|---|
| *H01L 31/058* | (2006.01) |
| *H01L 31/0232* | (2014.01) |
| *G01J 5/04* | (2006.01) |
| *G01J 5/02* | (2006.01) |
| *G01J 5/06* | (2006.01) |
| *G01J 5/20* | (2006.01) |
| *G01J 5/08* | (2006.01) |
| *H01L 31/09* | (2006.01) |

(52) U.S. Cl.
CPC .............. *H01L 31/0232* (2013.01); *G01J 5/023* (2013.01); *G01J 5/024* (2013.01); *G01J 5/0225* (2013.01); *G01J 5/045* (2013.01); *G01J 5/046* (2013.01); *G01J 5/06* (2013.01); *G01J 5/0809* (2013.01); *G01J 5/0853* (2013.01); *G01J 5/20* (2013.01); *H01L 31/09* (2013.01)

(58) Field of Classification Search
CPC ................ H01L 31/09; H01L 31/0232; H01L 27/14649; H01L 27/14683; G01J 5/046; G01J 5/045; G01J 5/0225; G01J 5/023; G01J 5/06; G01J 5/20; G01J 5/0809; G01J 5/0853
USPC ......................................................... 257/467
See application file for complete search history.

(56) References Cited

U.S. PATENT DOCUMENTS

| | | | |
|---|---|---|---|
| 7,002,153 B1 * | 2/2006 | Gillham et al. | ............ 250/338.1 |
| 7,683,324 B2 | 3/2010 | Vogt | |
| 7,868,298 B2 | 1/2011 | Feyh | |
| 8,080,797 B2 | 12/2011 | Vogt et al. | |
| 2004/0140428 A1 * | 7/2004 | Ionescu et al. | ............ 250/338.1 |
| 2004/0256559 A1 * | 12/2004 | Ryu et al. | ................... 250/338.3 |

(Continued)

FOREIGN PATENT DOCUMENTS

JP        2007263768 A1    10/2007

OTHER PUBLICATIONS

Akin, T., "CMOS-based Thermal Sensors," Ch. 10, CMOS-MEMS, p. 479-512, Feb. 29, 2008.

(Continued)

*Primary Examiner* — Trung Q Dang
(74) *Attorney, Agent, or Firm* — Maginot Moore & Beck LLP (57) ABSTRACT

In one embodiment, a MEMS sensor includes a mirror and an absorber spaced apart from the mirror, the absorber including a plurality of spaced apart conductive legs defining a tortuous path across an area directly above the mirror.

18 Claims, 6 Drawing Sheets

(56) References Cited

U.S. PATENT DOCUMENTS

| | | | |
|---|---|---|---|
| 2005/0082481 | A1 | 4/2005 | Vilain |
| 2006/0060786 | A1* | 3/2006 | Vilain ................. 250/338.1 |
| 2008/0265164 | A1 | 10/2008 | Ouvrier-Buffet et al. |
| 2010/0171190 | A1 | 7/2010 | Liger |
| 2013/0181808 | A1* | 7/2013 | Chen et al. ............. 338/22 SD |
| 2014/0054740 | A1* | 2/2014 | Yama et al. ................ 257/459 |

OTHER PUBLICATIONS

Invitation to Pay Additional Fees and Partial International Search Report corresponding to PCT Application No. PCT/US/2013/057280, mailed Jan. 8, 2014 (5 pages).

Lee, Hyung-Kew et al., A High Fill-Factor Infrared Bolometer Using Micromachined Multilevel Electrothermal Structures, IEEE Transactions on Electron Devices, Jul. 1, 1999, vol. 46, No. 7, Piscataway, NJ. (3 pages).

Forsberg, Fredrik et al., High-Performance Infrared Micro-Bolometer Arrays Manufactured Using Very Large Scale Heterogeneous Integration, 2011 International Conference on Optical MEMS and Nanophotonics, Aug. 8, 2011, pp. 9-10 (2 pages).

Socher, Eran et al., A Low-Cost CMOS Compatible Serpentine-Structured Polysilicon-Based Microbolometer Array, 12th International Conference on Transducers, Solid-State Sensors, Actuators and Microsystems, Jun. 9, 2003, pp. 320-323, vol. 1, Pisacataway, NJ (4 pages).

* cited by examiner

SERPENTINE IR SENSOR

This application claims the benefit of U.S. Provisional Application No. 61/695,361 filed Aug. 31, 2012, the entire contents of which is herein incorporated by reference.

FIELD

This disclosure relates to sensor devices and methods of fabricating such devices.

BACKGROUND

Objects at any non-zero temperature radiate electromagnetic energy which can be described either as electromagnetic waves or photons, according to the laws known as Planck's law of radiation, the Stefan-Boltzmann Law, and Wien's displacement law. Wien's displacement law states that the wavelength at which an object radiates the most ($\lambda_{max}$) is inversely proportional to the temperature of the object as approximated by the following relation:

$$\lambda_{max}(\mu m) \approx \frac{3000}{T(K)}$$

Hence for objects having a temperature close to room temperature, most of the emitted electromagnetic radiation lies within the infrared region. Due to the presence of $CO_2$, $H_2O$, and other gasses and materials, the earth's atmosphere absorbs electromagnetic radiation having particular wavelengths. Measurements have shown, however, that there are "atmospheric windows" where the absorption is minimal. An example of such a "window" is the 8 µm-12 µm wavelength range. Another window occurs at the wavelength range of 3 µm-5 µm. Typically, objects having a temperature close to room temperature emit radiation close to 10 µm in wavelength. Therefore, electromagnetic radiation emitted by objects close to room temperature is only minimally absorbed by the earth's atmosphere. Accordingly, detection of the presence of objects which are either warmer or cooler than ambient room temperature is readily accomplished by using a detector capable of measuring electromagnetic radiation emitted by such objects.

One commonly used application of electromagnetic radiation detectors is for automatically energizing garage door lights when a person or car approaches. Another application is thermal imaging. In thermal imaging, which may be used in night-vision systems for driver assistance, the electromagnetic radiation coming from a scene is focused onto an array of detectors. Thermal imaging is distinct from techniques which use photomultipliers to amplify any amount of existing faint visible light, or which use near infrared (~1 µm wavelength) illumination and near-infrared cameras.

Two types of electromagnetic radiation detectors are "photon detectors" and "thermal detectors". Photon detectors detect incident photons by using the energy of said photons to excite charge carriers in a material. The excitation of the material is then detected electronically. Thermal detectors also detect photons. Thermal detectors, however, use the energy of said photons to increase the temperature of a component. By measuring the change in temperature, the intensity of the photons producing the change in temperature can be determined.

In thermal detectors, the temperature change caused by incoming photons can be measured using temperature-dependant resistors (thermistors), the pyroelectric effect, the thermoelectric effect, gas expansion, and other approaches. One advantage of thermal detectors, particularly for long wavelength infrared detection, is that, unlike photon detectors, thermal detectors do not require cryogenic cooling in order to realize an acceptable level of performance.

One type of thermal sensor is known as a "bolometer." Even though the etymology of the word "bolometer" covers any device used to measure radiation, bolometers are generally understood to be to thermal detectors which rely on a thermistor to detect radiation in the long wavelength infrared window (8 µm-12 µm) or mid-wavelength infrared window (3 µm-5 µm).

The sensitivity of a bolometer generally increases with better thermal isolation of the sensor from its surroundings, with a higher infrared absorption coefficient, higher temperature coefficient of resistance, higher electrical resistance, and a higher bias current. Accordingly, because bolometers must first absorb incident electromagnetic radiation to induce a change in temperature, the efficiency of the absorber in a bolometer relates to the sensitivity and accuracy of the bolometer. Ideally, absorption as close to 100% of incident electromagnetic radiation is desired. In theory, a metal film having a sheet resistance (in Ohms per square) equal to the characteristic impedance of free space, laying over a dielectric or vacuum gap of optical thickness d will have an absorption coefficient of 100% for electromagnetic radiation of wavelength $4d$. The following relation shows the expression of the characteristic impedance (Y) of free space:

$$Y = \sqrt{\frac{\mu_0}{\varepsilon_0}}$$

wherein $\varepsilon_0$ is the vacuum permittivity and $\mu_0$ is the vacuum permeability.

The numerical value of the characteristic impedance of free space is close to 377 Ohm. The optical length of the gap is defined as "nd", where n is the index of refraction of the dielectric, air or vacuum.

In the past, micro-electromechanical systems (MEMS) have proven to be effective solutions in various applications due to the sensitivity, spatial and temporal resolutions, and lower power requirements exhibited by MEMS devices. One such application is as a bolometer. Known bolometers use a supporting material which serves as an absorber and as a mechanical support. Typically, the support material is silicon nitride. A thermally sensitive film is formed on the absorber to be used as a thermistor. The absorber structure with the attached thermistor is anchored to a substrate through suspension legs having high thermal resistance in order for the incident electromagnetic radiation to produce a large increase of temperature on the sensor.

The traditional technique used to micromachine suspended members involves the deposition of the material over a "sacrificial" layer, which is to be eventually removed and which is deposited, e.g., by spin coating or polymer coating using a photoresist. The deposition of the thin-film metal or semiconductor can be done with a variety of techniques including low-pressure chemical vapor deposition (LPCVD), epitaxial growth, thermal oxidation, plasma-enhanced chemical vapor deposition (PECVD), sputtering, and evaporation.

Most of the known bolometers, however, have a generally rectangular absorber. Such absorbers exhibit reduced thermal isolation and low electrical resistance, lowering the responsivity of the device.

It would be beneficial to provide an infrared sensor which exhibited increased sensitivity. A sensor which provides efficient thermal absorption is also desired. It would be beneficial for such a sensor to exhibit increased thermal isolation and high electrical resistance. A sensor with increased sensitivity which could be manufactured using known manufacturing processes would be further beneficial.

SUMMARY

In one embodiment a MEMS sensor includes a mirror and an absorber spaced apart from the mirror, the absorber including a plurality of spaced apart conductive legs defining a tortuous path across an area directly above the mirror.

In another embodiment, a method of forming a MEMS sensor includes providing an insulation layer, forming a mirror on the insulation layer, and forming an absorber spaced apart from the mirror by forming a plurality of spaced apart conductive legs defining a tortuous path across an area directly above the mirror.

DESCRIPTION

For the purposes of promoting an understanding of the principles of the disclosure, reference will now be made to the embodiments illustrated in the drawings and described in the following written specification. It is understood that no limitation to the scope of the disclosure is thereby intended. It is further understood that the present disclosure includes any alterations and modifications to the illustrated embodiments and includes further applications of the principles of the disclosure as would normally occur to one skilled in the art to which this disclosure pertains.

Figure 1:
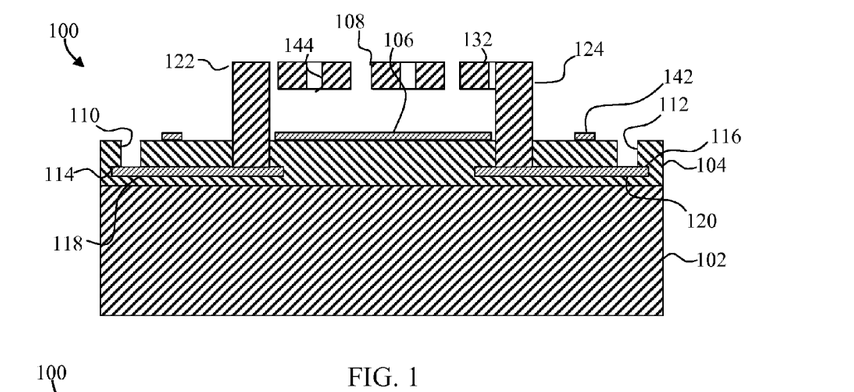
FIG. 1 depicts a side cross-sectional view of a bolometer device taken along line A-A of FIG. 2, the bolometer device including an absorber that provides increased thermal isolation and higher electrical resistivity using combinations of forty-five degree angled sections of end portions to connect linear leg portions in accordance with principles of the present disclosure.
Figure 2:
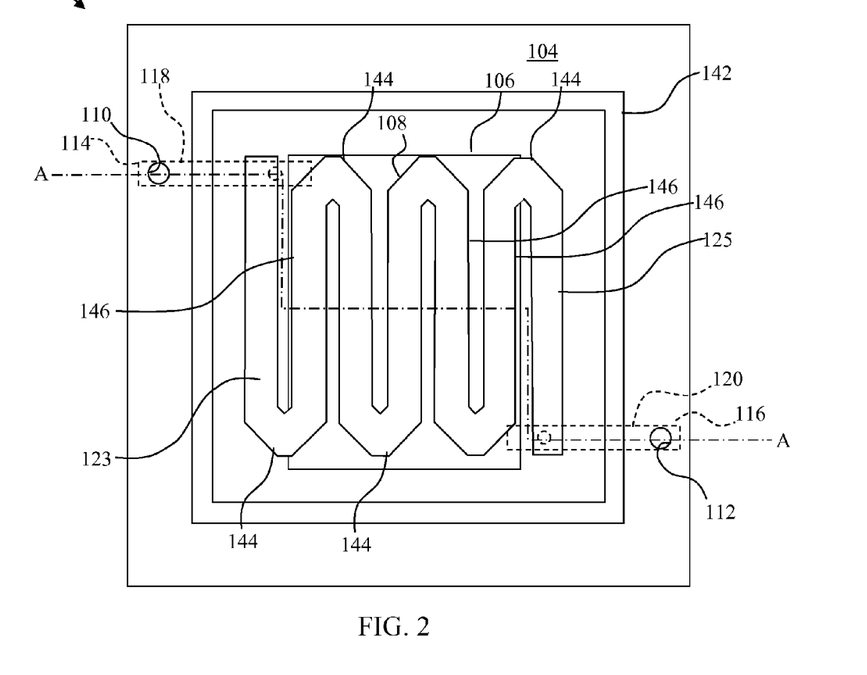
FIG. 2 depicts a top plan view of the bolometer of FIG. 1.

A semiconductor sensor assembly 100 is depicted in FIGS. 1 and 2. FIG. 1 depicts a side cross-sectional view of the semiconductor sensor assembly 100, which in this embodiment is a bolometer, while FIG. 2 is a top plan view of the sensor assembly 100. The sensor assembly 100 in one embodiment is formed on a complementary metal oxide semiconductor (CMOS) substrate or on another type of substrate. The sensor assembly 100 includes a substrate 102, an insulator layer 104, a mirror 106 and an absorber 108. The substrate 102, which in this embodiment is a silicon wafer that may include one or more sensor assemblies 100, includes the electronic circuitry used to access the output of the sensor assembly 100.

The insulator layer 104 in one embodiment is a deposited dielectric like, e.g., $SiO_2$, which includes access openings 110 and 112 which provide access to bond pads 114 and 116, respectively, within the insulator layer 104. The bond pads 114 and 116 are conductively connected to respective buried feed-throughs 118 and 120 which extend within the insulator layer 104 to conductive support posts 122 and 124.

The support posts 122 and 124 extend upwardly from the buried feed throughs 118 and 120 to support the absorber 108 at a location above the upper surface of the insulator layer 104. Each of the support posts 122/124 supports the absorber 108 through respective support bar 123/125.

The mirror 106 is located on the upper surface of the insulator layer 104 along with a bond ring 142. The bond ring 142 extends completely about the support posts 122/124 and the absorber 108 but inside of the access openings 110 and 112. The bond ring 142 is used to form a bond with a cap (not shown) thereby protecting the absorber 108 while the access openings and structures within the insulator layer 104 allow for electrical communication between the absorber 108 and external electronics. The cap further allows encapsulation of a vacuum in the space occupied by the absorber 108 to ensure proper and reliable operation of the sensor assembly 100. More than one sensor assembly 100 can be encapsulated under the same cap structure.

The mirror 106 is directly beneath the absorber 108 and may be, for example, a metal reflector or a multilayer dielectric reflector. The absorber 108 is spaced apart from the mirror 106 by a gap of about 2.0 to 3.0 μm. The gap in this embodiment is selected to optimize absorption in the long-wavelength infrared region (8-15 microns).

The absorber 108, in addition to absorbing energy from incident photons, is selected to provide a good noise-equivalent temperature difference (NETD). In order for the absorber 108 to have a good NETD, the material selected to form the absorber 108 should exhibit a high temperature coefficient of resistance while exhibiting low excess noise (1/f noise). Semiconductor materials such as vanadium oxide are common in micromachined bolometers due to their high temperature coefficient of resistance. Other materials include Si (poly/amorphous), SiGe, Ge, Pt, TiN, Ti, and combinations of the foregoing. While metals have a lower temperature coefficient of resistance than some semiconductor materials, such as vanadium oxide, metals typically have much lower excess noise than many semiconductor materials, thus offering better NETD.

Accordingly, in one embodiment the absorber 108 comprises metal. Titanium and Platinum are two metals which exhibit desired characteristics. Titanium, for example, exhibits a bulk resistivity of about $7*10^{-7}$ Ohm. Using a bulk resistivity of $7*10^{-7}$ Ohm, the thickness of the absorber 108 needed to match the impedance of free-space (377 Ohm/square) should be about 1.9 nm. The resistivity of materials formed to a thickness less than about 50 nm, however, can be several times higher than the bulk value. Accordingly, depending on process parameters, the thickness of the absorber 108, if made from titanium, is preferably about 10 nm. Impurities can also be introduced into the absorber 108 during formation in order to tune the resistivity if needed.

Consequently, the thickness of the absorber 108 in this embodiment is about 10 nm and the length of the absorber 108 from the support post 122 to the support post 124 is typically between 15 μm and 70 μm. This configuration provides a ratio between the thickness of the absorber 108 and the length of the absorber 108 on the order of 1/1000 and the ratio of the thickness of the absorber 108 to the gap width of about 1/100. The actual distance along the absorber 108 between the posts 122/124 is increased, however, because the absorber 108 is serpentine.

The absorber 108 is a free-standing serpentine wire structure. The free-standing serpentine wire structure provides better thermal isolation and higher electrical resistance (and therefore a higher responsivity) without an increase in size over typical absorber structures which are generally rectangular. For example, the serpentine nature of the absorber 108 increases the lineal distance along the absorber 108 between the posts 122/124 by a factor of over 5 compared to a rectangular absorber.

The absorber 108 also includes end structures 144 which connect leg portions 146 to each other or to the support bars 123/125. The end structures 144 are not configured using ninety degree angles. Rather, four forty-five degree angled sections are used to generate a 180 degree change in direction between the leg portions 146. Accordingly, current crowding and high mechanical stress fields are avoided.

Figure 3:
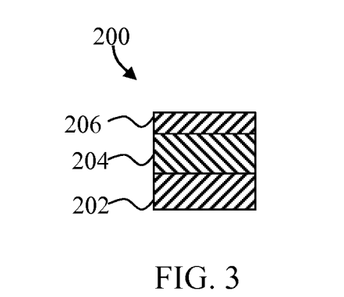
FIG. 3 depicts a side cross-sectional view of a wire absorber including multiple layers of different materials to provide a rectangular cross-section.
Figure 4:
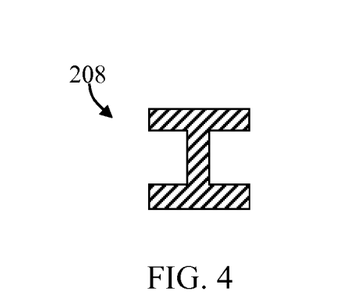
FIG. 4 depicts a side cross-sectional view of a wire absorber shaped as an I-beam to provide additional strength.

In the embodiment of FIGS. 1 and 2, the absorber 108 is generally rectangular in cross-section (see FIG. 1). Depending upon the particular embodiment, a simple rectangular cross section may not provide the desired rigidity or strength. Accordingly, in other embodiments, other cross-sectional shapes and configurations are used. By way of example, FIG. 3 depicts an absorber section 200 that includes a base layer 202, a middle layer 204, and an upper layer 206. The materials for the various layers in the absorber section 200 are selected for the desired strength, absorption, and other properties. FIG. 4 depicts an absorber section 208 formed in the shape of an I-beam for additional strength.

Figure 5:
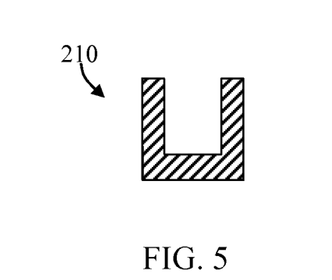
FIG. 5 depicts a side cross-sectional view of a wire absorber shaped as a "U" to provide additional strength.
Figure 6:
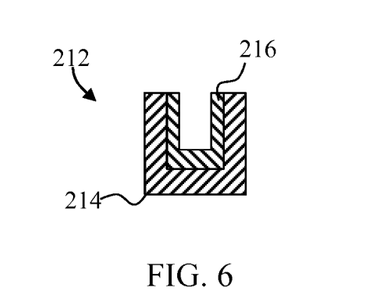
FIG. 6 depicts a side cross-sectional view of a wire absorber with multiple materials layered and shaped as a "U" to provide additional strength and other desired characteristics.

FIG. 5 depicts a "U-shaped" wire absorber 210. The wire absorber 210 in some embodiments is constructed in the manner described in U.S. patent application Ser. No. 13/415, 479, filed Mar. 8, 2012, the entire contents of which are herein incorporated by reference. The U-shape provides additional strength. FIG. 6 depicts a similar absorber section 212 that includes an outer U-shaped section 214 and an inner U-shaped section 216 formed with a different material.

Returning to FIGS. 1 and 2, the total resistance for the sensor assembly 100 measured across the support posts 122/124 and the absorber 108 is defined by the following equation:

$$R=n*R_a$$

where n is the number of linear leg portions 132 and $R_a$ is the resistance of one of the linear leg portions, which together form the absorber 108. The resistance of the support posts 122/124 is de minimis because of the relatively large bulk of material and the short length compared to the support leg portions.

Upon impingement of the absorber 108 with electromagnetic radiation, the average temperature of the absorber 108 increases by ΔT. The electrical resistance of the sensor upon incident radiation changes by an amount ΔR given by:

$$\Delta R=\alpha n R_a \Delta T$$

where α is the temperature coefficient of resistance of the thin film.

In one embodiment, the width of the linear leg portion is significantly smaller than the wavelength of the infrared radiation to be measured (8 μm-12 μm or 3 μm-5 μm) (also referred to as the "target" wavelength). Therefore, the assembly of linear leg portions is seen as an effective medium by the incoming infrared radiation and forms an efficient absorber.

In one embodiment, the gaps between the linear leg portions is significantly smaller than the target wavelength (8 µm-12 µm or 3 µm-5 µm). Therefore, the assembly of linear leg portions as a total are seen as an effective medium by the incoming infrared radiation and forms an efficient absorber. Thus, the incoming IR radiation sees an increased effective sheet resistance and the aforementioned 377 ohm condition can be achieved with higher film thicknesses.

When electromagnetic radiation (e.g. infrared light) reaches the sensor assembly 100, the electromagnetic radiation is absorbed within the thin-film metal of the absorber 108 with an efficiency depending on the resistivity of the absorber 108, quality of the mirror 106, gap height between the absorber 108 and the mirror 106, and radiation wavelength. Upon absorbing the incident radiation, the absorber 108 undergoes an increase in temperature. This temperature increase, in turn, leads to either a decrease or increase of the resistivity of the absorber 108. The absorber 108 is then electrically probed to measure the resistivity of, and thus indirectly measure the amount of incident electromagnetic radiation on, the absorber 108.

In one embodiment, due to the typical resistivity of deposited metals and semiconductors, the suspended thin-film absorber 108 has a thickness inferior to 50 nm. Features of the deposition technique known as atomic layer deposition is preferred for this embodiment over traditional micromachining techniques, e.g. sputtering and evaporation, in forming the absorber 108. One advantage of this device over many known devices is its simplicity of fabrication which is explained with reference to FIGS. 7-14.

Figure 7:
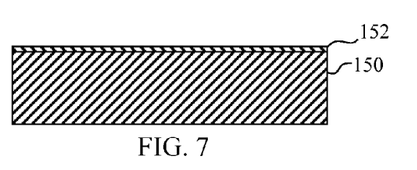
FIG. 7 depicts a side cross-sectional view taken along a line similar to the line A-A of FIG. 2, of a device substrate which in this embodiment is a complementary metal oxide semiconductor (CMOS), with a partial insulator layer formed on the substrate in accordance with principles of the present disclosure.

Fabrication of a sensor such as the sensor assembly 100 begins with preparation of a substrate 150 which is shown in FIG. 7. The substrate 150 may be a portion of a larger substrate that is used to form a number of sensors. An initial insulator layer portion 152 is formed on the upper surface of the substrate 150. In this example, an oxide film of about 1000 A is formed on the substrate 150.

Figure 8:
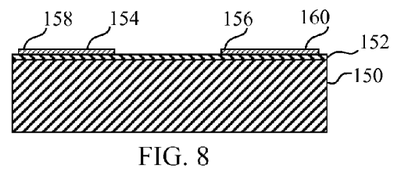
FIG. 8 depicts a side cross-sectional view taken along a line similar to the line A-A of FIG. 2, of the device of FIG. 7 after feed throughs and associated bond pads have been formed on the partial insulator layer.
Figure 9:
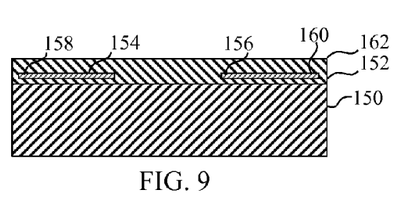
FIG. 9 depicts a side cross-sectional view taken along a line similar to the line A-A of FIG. 2, of the device of FIG. 8 after the remainder of the insulator layer has been formed above the feed throughs and associated bond pads.

Next, feed throughs 154 and 156 along with associated bond pads 158 and 160 are formed on the upper surface of the initial insulator layer portion 152 (FIG. 8). The feed throughs 154/156 and the bond pads 158/160 are formed from a conducting metal by any acceptable process such as one incorporating lithography and plasma etching. The remainder of the insulator layer 162 is then formed thereby encapsulating the feed throughs 154/156 and the bond pads 158/160 (FIG. 9). The insulator layer 162 may be planarized if desired. In some embodiments, one or more of the feed throughs 154/156 may be connected to another portion of the CMOS device, e.g., a transistor.

Figure 10:
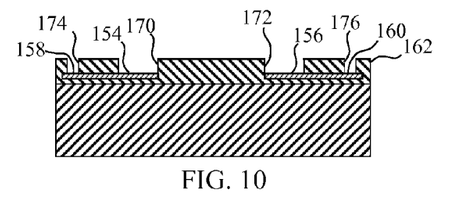
FIG. 10 depicts a side cross-sectional view taken along a line similar to the line A-A of FIG. 2, of the device of FIG. 9 with openings formed through the insulator layer to expose the bond pads and a portion of the feed throughs.
Figure 11:
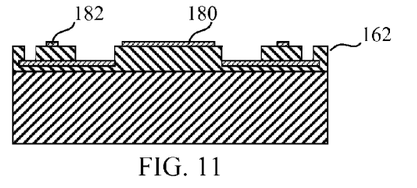
FIG. 11 depicts a side cross-sectional view taken along a line similar to the line A-A of FIG. 2, of the device of FIG. 10 with a mirror and a bond ring formed on top of the insulator layer.
Figure 12:
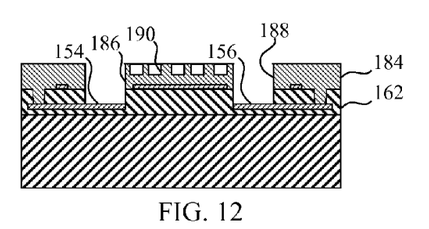
FIG. 12 depicts a side cross-sectional view taken along a line similar to the line A-A of FIG. 2, of the device of FIG. 11 after a sacrificial layer has been formed over the substrate, and openings through the sacrificial layer to the feed throughs have been formed along with a trench between the openings.

Referring to FIG. 10, portions of the feed throughs 154/156 and the bond pads 158/160 are then exposed by etching a trench completely through the insulator layer 162 to form openings 170, 172, 174, and 176, respectively. In FIG. 11, a mirror 180 and a bond ring 182 are formed on the upper layer of the insulator layer 162. The mirror 180 and the bond ring 182 may be formed by sputtering, lithography, and etching, or any other acceptable process. The bond ring 182 and the mirror 180 may be formed simultaneously if desired.

A sacrificial layer 184 is then formed over the top of the insulator layer 162, the mirror 180, and the bond ring 182 (FIG. 12) and openings 186 and 188 are formed by etching a trench completely through the sacrificial layer 184 to expose portions of the feed throughs 154 and 156, respectively. A serpentine trench 190 is also formed in the sacrificial layer 184 connecting the openings 186 and 188. The openings 186/188 and the trench 190 may be formed using spin photoresist and lithography.

In embodiments wherein electrical contact is provided using through silicon vias in the backside of the substrate 150, the insulator layer 162 is not needed. Moreover, the mirror 180 may also be formed using the same material used to form the feed throughs 154/156. Thus, the layers depicted in FIGS. 7-12 as 162 and 184 may be formed as a single layer.

Figure 13:
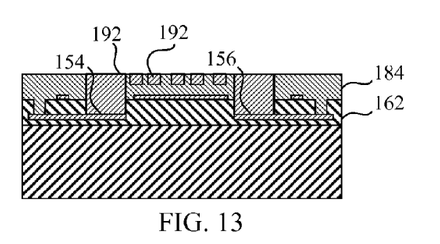
FIG. 13 depicts a side cross-sectional view taken along a line similar to the line A-A of FIG. 2, of the device of FIG. 12 with an absorber layer formed within the openings and trench and directly above the mirror without extending into the portion of the sacrificial layer directly above the bond ring.

An absorber layer 192 is then formed above a portion of the sacrificial layer 184, on the exposed surface portions of the feed throughs 154/156, on the sides of the openings 186 and 188, and along the walls and bottom of the trench 190. In some embodiments, the openings 186 and 188 are first filled, followed by forming of the trench 190 and filling of the trench 190 with an absorber layer. In different embodiments, a different material is used to fill a trench portion which becomes the support bars 123/125 and/or the support posts 122/124 as compared to the material used to form the absorber. Such modification simply requires modification of the timing of forming of the different trench/openings.

The absorber layer 192 in some embodiments is formed by atomic layer deposition (ALD). ALD is used to deposit materials by exposing a substrate to several different precursors sequentially. A typical deposition cycle begins by exposing a substrate is to a precursor "A" which reacts with the substrate surface until saturation. This is referred to as a "self-terminating reaction." Next, the substrate is exposed to a precursor "B" which reacts with the surface until saturation. The second self-terminating reaction reactivates the surface. Reactivation allows the precursor "A" to react with the surface. Typically, the precursors used in ALD include an organometallic precursor and an oxidizing agent such as water vapor or ozone.

The deposition cycle results, ideally, in one atomic layer being formed. Thereafter, another layer may be formed by repeating the process. Accordingly, the final thickness of the absorber layer 192 is controlled by the number of cycles a substrate is exposed to. Moreover, deposition using an ALD process is substantially unaffected by the orientation of the particular surface upon which material is to be deposited. Accordingly, an extremely uniform thickness of material may be realized both on the horizontal surfaces (the sacrificial layer 184, the exposed surface portions of the feed throughs 154/156, and the bottom of the trench 190) and on the vertical surfaces (the sides of the openings 186 and 188, the walls of the trench 190). Thus, in some embodiments the posts 122/124 are hollow, and may be further anchored as described in the '479 application.

In some embodiments, it may be desired to form structures using multiple layers of ALD material. For example, while the device in the present example includes a single absorber layer 192, a stacked absorber may be useful in different embodiments. A stacked absorber or other structure may have two, three, or more layers of different or alternating materials. For example, a layer of insulating material may provide a substrate for a layer of a conducting material with yet another insulating material above the conducting material. A very thin conducting layer may thus be protected and strengthened by being sandwiched between two very thin insulating layers. $Al_2O_3$ may be used as an insulating layer deposited using ALD.

Figure 14:
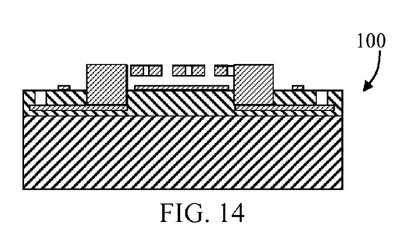
FIG. 14 depicts a side cross-sectional view taken along a line similar to the line A-A of FIG. 2, of the device of FIG. 13 with the sacrificial layer removed.

Once the absorber layer 192 is formed, the sacrificial layer 184 is then etched to form the final device, such as the sensor assembly 100 of FIGS. 1 and 2 (FIG. 14).

Figure 15:
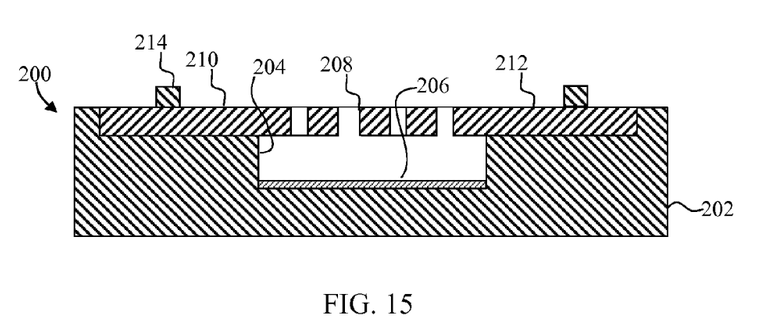
FIG. 15 depicts a side cross-sectional view of a bolometer device taken along line A-A of FIG. 16, the bolometer device including an absorber that provides increased thermal isolation and higher electrical resistivity using combinations of two ninety degree curved pieces in an end portion to connect linear leg portions in accordance with principles of the present disclosure.

In some embodiments, the wire absorber is not supported by posts such as the posts 122/124. By way of example, FIG. 15 depicts a sensor assembly 200 that includes a substrate 202. A cavity 204 is formed in the substrate 202 and a mirror 206 is positioned at the bottom of the cavity. An absorber 208 is directly supported by the substrate 202. Feed throughs 210/212 extend outwardly from the absorber 208 beneath a bond ring 214.

Figure 16:
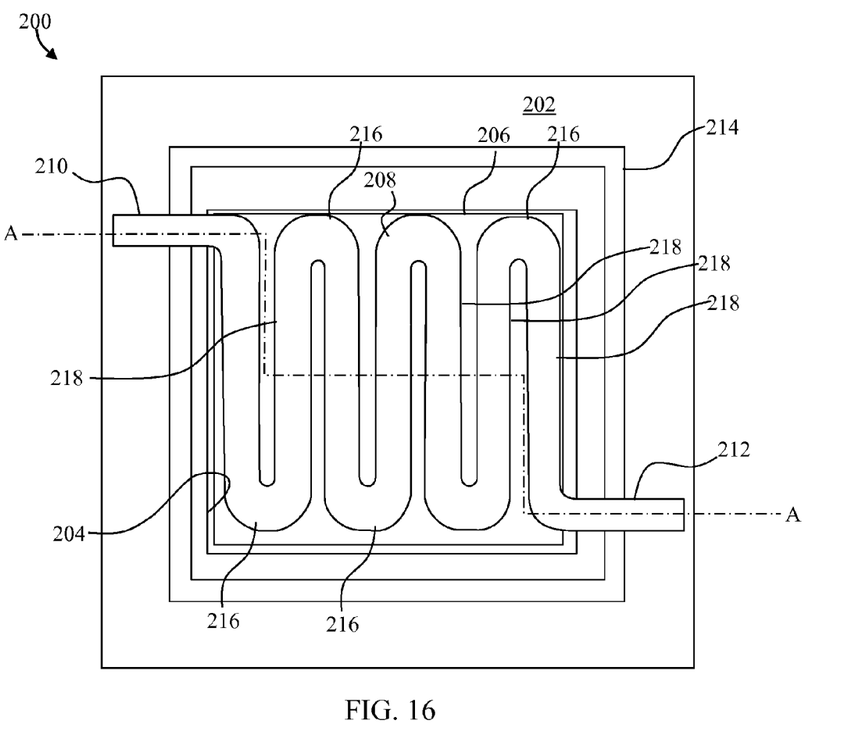
FIG. 16 depicts a top plan view of the bolometer of FIG. 15.

As shown in FIG. 16, the absorber 208 includes end structures 216 which connect leg portions 218 to each other. The end structures 216 are not configured using ninety degree angles. Accordingly, current crowding and high mechanical stress fields are avoided. The end structures 216 are thus similar to the end structures 144, although more rounded.

The manufacture of the sensor assembly 200 is simpler than the sensor assembly 100. For example, after providing the substrate 202, the cavity 204 is formed and the mirror 206 formed within the cavity 204. A sacrificial material (not shown) is then used to fill the cavity 204 and a trench is formed in the upper surface of the substrate 202 and the sacrificial material (not shown) in the desired shape of the absorber 208 and feed throughs 210/212. The trench is then filled with an absorber material, and the bond ring 214 is formed. The sacrificial material (not shown) is then etched, resulting in the configuration of FIGS. 15-16.

Figure 17:
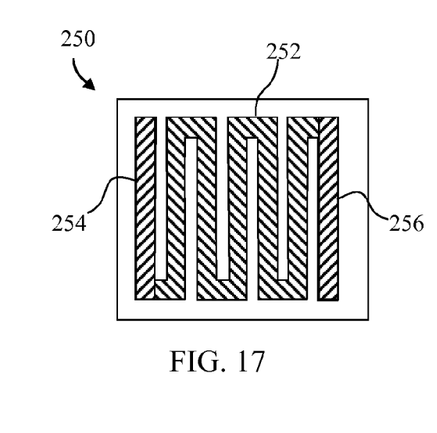
FIG. 17 depicts a simplified top plan view of a bolometer device including a serpentine absorber that provides increased thermal isolation and higher electrical resistivity using combinations of ninety degree angled pieces in an end portion to connect linear leg portions.

While the foregoing configurations are selected to reduce current crowding and high mechanical stress fields, other shapes for the absorber 108/208 are possible. In some embodiments, the absorber 108/208 is formed with ninety degree angles. For example, FIG. 17 is a simplified depiction of a sensor assembly 250 that is similar to the sensor assembly 100. The sensor assembly 250 differs from the sensor assembly 100 in that the serpentine absorber 252 includes ninety degree angles. Additionally, the absorber 252 is supported by support bars 254 and 256 which are formed from a material different from the absorber material (indicated by the different hashing).

Figure 18:
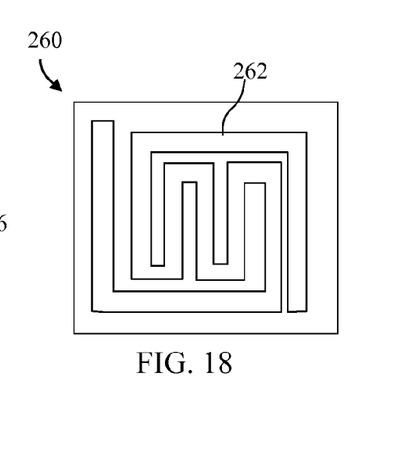
FIG. 18 depicts a simplified top plan view of a bolometer device including a complex serpentine absorber that provides increased thermal isolation and higher electrical resistivity using combinations of ninety degree angled pieces in an end portion to connect linear leg portions.

FIG. 18 is a simplified depiction of another embodiment of a sensor assembly 260 that is similar to the sensor 100. The sensor assembly 260 differs from the sensor assembly 100 in that the absorber 262 includes ninety degree angles, and is a more complex shape than the serpentine absorber 108.

Figure 19:
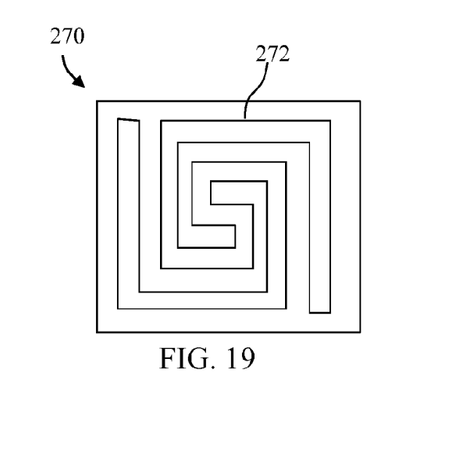
FIG. 19 depicts a simplified top plan view of a bolometer device including a complex absorber that provides increased thermal isolation and higher electrical resistivity using combinations of ninety degree angled pieces in an end portion to connect linear leg portions.

FIG. 19 is a simplified depiction of another embodiment of a sensor assembly 270 that is similar to the sensor 100. The sensor assembly 270 differs from the sensor assembly 100 in that the absorber 272 includes ninety degree angles, and is a more complex shape than the serpentine absorber 108.

Figure 20:
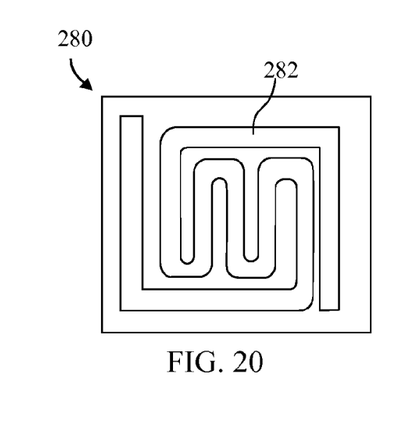
FIG. 20 depicts a simplified top plan view of a bolometer device including a complex serpentine absorber that provides increased thermal isolation and higher electrical resistivity using combinations of ninety degree curved pieces in an end portion to connect linear leg portions.

In some embodiments, the ninety degree angles of the absorbers 252, 262, and 272 are rounded to reduce current crowding and high mechanical stress fields. By way of example, FIG. 20 is a simplified depiction of a sensor assembly 280 which is similar to the sensor 260 except that the absorber 262 includes rounded corners.

Figure 21:
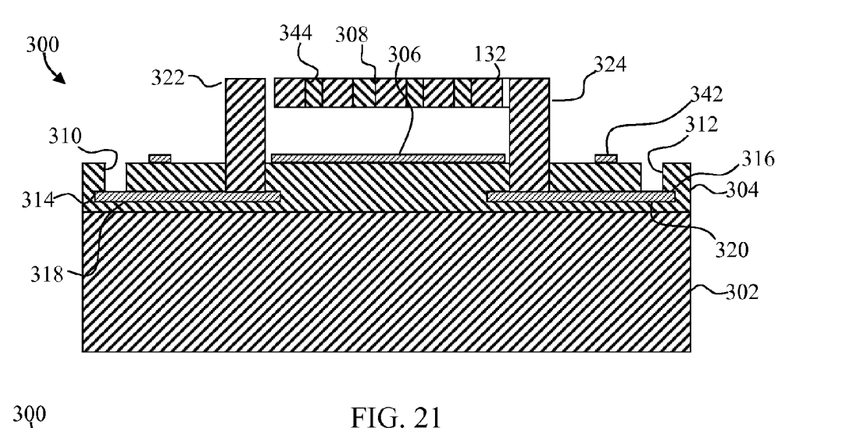
FIG. 21 depicts a side cross-sectional view of a bolometer device taken along line A-A of FIG. 22, the bolometer device including an absorber that provides increased thermal isolation and higher electrical resistivity using combinations of forty-five degree angled sections of end portions to connect linear leg portions formed within an nonconductive stiffening sheet in accordance with principles of the present disclosure.
Figure 22:
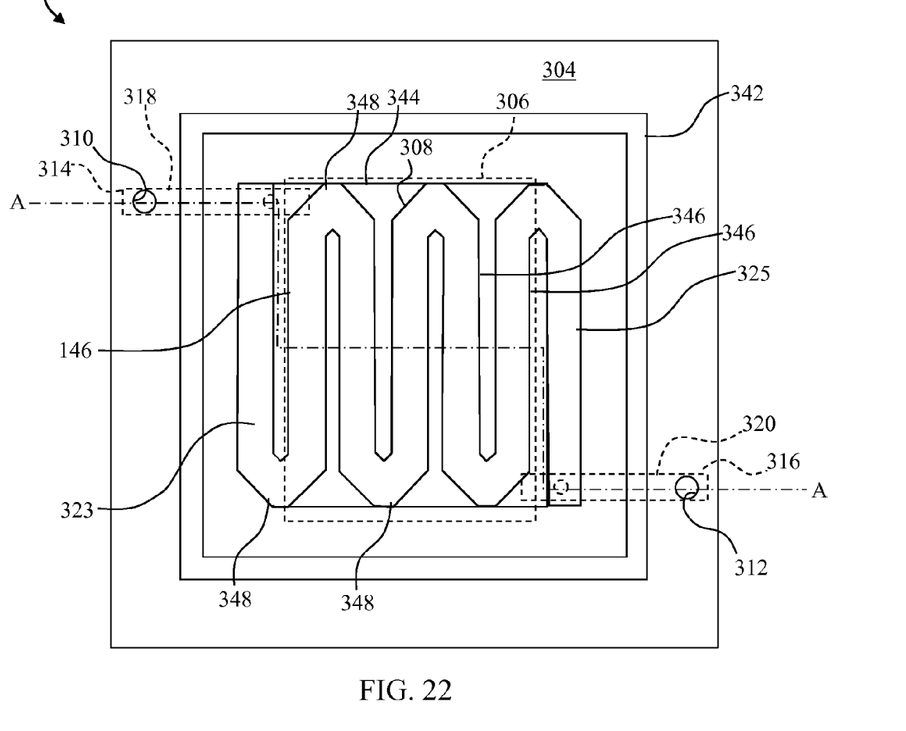
FIG. 22 depicts a top plan view of the bolometer of FIG. 21.

In some embodiments, additional stiffness is provided. By way of example, a semiconductor sensor assembly 300 is depicted in FIGS. 21 and 22. The sensor assembly 300 is similar to the sensor assembly 100 of FIGS. 1 and 2, including a substrate 302, an insulator layer 304, a mirror 306 and an absorber 308.

The insulator layer 304 includes access openings 310 and 312 which provide access to bond pads 314 and 316, respectively, within the insulator layer 304. The bond pads 314 and 316 are conductively connected to respective buried feedthroughs 318 and 320 which extend within the insulator layer 304 to conductive support posts 322 and 324.

The support posts 322 and 324 extend upwardly from the buried feedthroughs 318 and 320 to support the absorber 308 at a location above the upper surface of the insulator layer 304. Each of the support posts 322/324 supports the absorber 308 through respective support bar 323/325.

The mirror 306 is located on the upper surface of the insulator layer 304 along with a bond ring 342. The bond ring 342 extends completely about the support posts 322/324 and the absorber 308 but inside of the access openings 310 and 312. The mirror 306 is directly beneath the absorber 308.

The absorber 308 is a supported serpentine structure which includes a support plate 344 in which leg portions 346 extend. The support plate 344 is a non-conductive material which provides strength/rigidity to the absorber 308 without altering the electrical characteristics of the absorber 308. The leg portions 346 are electrically connected by end structures 348. The support plate 344 in one embodiment is released at the same time as the absorber 308.

In some embodiments, a support plate like support plate 344 is added to the structures depicted in FIGS. 16-20.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

The invention claimed is:

1. A MEMS sensor, comprising:
   a mirror;
   an absorber spaced apart from the mirror, the absorber including a plurality of spaced apart conductive legs defining a tortuous path across an area directly above the mirror, such that when projected on a plane defined by the mirror at least two of the plurality of spaced apart conductive legs are spaced apart from each other by a gap in the absorber which is directly above the mirror; and
   at least one conductive end portion in the absorber, the at least one end portion in electrical communication with a first and a second of the plurality of spaced apart conductive legs and configured such that when projected on the plane, the at least one end portion does not define any ninety degree angles.

2. The MEMS sensor of claim 1, wherein the at least one conductive end portion is configured such that when projected on the plane defined by the mirror, the at least one conductive end portion defines an inner curve and an outer curve.

3. The MEMS sensor of claim 2, wherein the plurality of spaced apart conductive legs and at least one conductive end portion are configured such that when projected onto the plane, the plurality of spaced apart conductive legs and at least one conductive end portion define a serpentine shape.

4. The MEMS sensor of claim 2, wherein each of the plurality of spaced apart conductive legs comprises a plurality of layers.

5. The MEMS sensor of claim 4, wherein the plurality of layers comprise:
   a substrate layer;
   a conductive layer on an upper surface of the substrate layer; and
   an insulation layer on an upper surface of the conductive layer.

6. The MEMS sensor of claim 2, wherein each of the plurality of spaced apart conductive legs defines a generally I-beam shaped cross-section.

7. The MEMS sensor of claim 2, wherein each of the plurality of spaced apart conductive legs defines a generally "U" shaped cross-section.

8. The MEMS sensor of claim 2, wherein the plurality of spaced apart conductive legs and at least one conductive end portion are formed within a support plate, the support plate extending at least from directly above a first end of the mirror to directly above a second end of the mirror.

9. The MEMS sensor of claim 2, further comprising:
- a first support post extending above the plane and supporting a first end portion of the absorber; and
- a second support post extending above the plane and supporting a second end portion of the absorber.

10. The MEMS sensor of claim 9, further comprising:
- an insulator layer supporting the mirror on an upper surface of the insulator layer;
- a bond ring supported on the upper surface of the insulator layer;
- a first feed through extending through the insulator layer beneath the bond ring and in electrical communication with the first support post; and
- a second feed through extending through the insulator layer beneath the bond ring and in electrical communication with the second support post.

11. The MEMS sensor of claim 2, wherein the first and second spaced apart conductive legs define a gap therebetween when projected onto the plane, the gap having a minimum width that is smaller than a target wavelength for the MEMS sensor.

12. The MEMS sensor of claim 11, wherein the first of the plurality of spaced apart conductive legs defines a minimum leg width which when projected onto the plane is smaller than the target wavelength.

13. A method of forming a MEMS sensor, comprising:
- providing an insulation layer;
- forming a mirror on the insulation layer;
- forming an absorber spaced apart from the mirror by forming a plurality of spaced apart conductive legs defining a tortuous path across an area directly above the mirror, such that when projected on a plane defined by the mirror at least two of the plurality of spaced apart conductive legs are spaced apart from each other by a gap in the absorber which is directly above the mirror; and
- forming at least one conductive end portion spaced apart from the mirror and in electrical communication with a first and a second of the plurality of conductive legs and configured such that when projected on the plane, the at least one end portion does not define any ninety degree angles.

14. The method of forming a MEMS sensor of claim 13, wherein forming the at least one conductive end portion comprises forming the at least one conductive end portion such that when projected on the plane defined by the mirror, the at least one conductive end portion defines an inner curve and an outer curve.

15. The method of forming a MEMS sensor of claim 14, wherein forming the plurality of spaced apart conductive legs and forming the at least one conductive end portion comprises forming the plurality of spaced apart conductive legs and forming the at least one conductive end portion such that when projected onto the plane, the plurality of spaced apart conductive legs and at least one conductive end portion define a serpentine shape.

16. The method of forming a MEMS sensor of claim 13, wherein forming the plurality of spaced apart conductive legs comprises:
- forming a substrate layer;
- forming a conductive layer on an upper surface of the substrate layer; and
- forming an insulation layer on an upper surface of the conductive layer.

17. The method of forming a MEMS sensor of claim 16, further comprising:
- identifying a target wavelength for the MEMS sensor, and wherein forming the plurality of spaced apart conductive legs comprises spacing the first and the second of the plurality of spaced apart conductive legs by a distance that is smaller than the target wavelength.

18. The method of forming a MEMS sensor of claim 17, wherein forming the plurality of spaced apart conductive legs comprises forming each of the plurality of spaced apart conductive legs with a minimum leg width which when projected onto the mirror is smaller than the target wavelength.

* * * * *